(12) United States Patent
Baselmans et al.

(10) Patent No.: US 7,834,980 B2
(45) Date of Patent: Nov. 16, 2010

(54) LITHOGRAPHIC APPARATUS AND METHOD

(75) Inventors: Johannes Jacobus Matheus Baselmans, Oirschot (NL); Andrey S. Tychkov, Veldhoven (NL)

(73) Assignee: ASML Netherlands B. V., Veldhoven (NL)

( * ) Notice: Subject to any disclaimer, the term of this patent is extended or adjusted under 35 U.S.C. 154(b) by 706 days.

(21) Appl. No.: 11/642,982

(22) Filed: Dec. 21, 2006

(65) Prior Publication Data

US 2008/0151206 A1 Jun. 26, 2008

(51) Int. Cl.
*G03B 27/42* (2006.01)

(52) U.S. Cl. .......................................... 355/67; 355/53

(58) Field of Classification Search ............... 355/53, 355/67
See application file for complete search history.

(56) References Cited

U.S. PATENT DOCUMENTS

| | | | |
|---|---|---|---|
| 4,970,546 A * | 11/1990 | Suzuki et al. ................. 355/53 |
| 5,191,374 A * | 3/1993 | Hazama et al. ................ 355/43 |
| 5,621,499 A * | 4/1997 | Shiozawa ..................... 355/67 |
| 5,684,566 A * | 11/1997 | Stanton ....................... 355/67 |
| 6,222,615 B1 * | 4/2001 | Suzuki ........................ 355/68 |
| 6,331,885 B1 * | 12/2001 | Nishi ........................... 355/53 |

* cited by examiner

*Primary Examiner*—Hung Henry Nguyen
*Assistant Examiner*—Colin Kreutzer
(74) *Attorney, Agent, or Firm*—Pillsbury Winthrop Shaw Pittman LLP (57) ABSTRACT

A method of lithography is disclosed that includes conditioning a radiation beam using an illumination system of a lithographic apparatus, imparting the radiation beam with a pattern in its cross-section, and projecting the patterned beam of radiation as an exposure field onto a substrate, wherein a periodic interference pattern is present in the exposure field, and relative motion is established between the substrate and a component in the illumination system, such that the periodic interference pattern is displaced in a direction which is not parallel to a direction of repetition of the periodic interference pattern.

22 Claims, 7 Drawing Sheets

$$\sin(\theta) = k \cdot \frac{\lambda}{p}$$

LITHOGRAPHIC APPARATUS AND METHOD

FIELD

The present invention relates to a lithographic apparatus and method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the beam in a given direction (the "scanning"-direction) while synchronously scanning the substrate parallel or anti-parallel to this direction.

There is a continual drive to manufacture integrated circuits having smaller and smaller components. This leads to lithographic apparatus with higher resolution and better accuracy.

SUMMARY

It is desirable, for example, to reduce the impact of radiation interference effects on the performance of a lithographic apparatus.

According to an aspect of the invention, there is provided a method of lithography, comprising:
  conditioning a radiation beam using an illumination system of a lithographic apparatus;
  imparting the radiation beam with a pattern in its cross-section; and
  projecting the patterned beam of radiation as an exposure field onto a substrate,
  wherein a periodic interference pattern is present in the exposure field, and relative motion is established between the substrate and a component in the illumination system, such that the periodic interference pattern is displaced in a direction which is not parallel to a direction of repetition of the periodic interference pattern.

According to an aspect of the invention, there is provided a lithographic apparatus comprising:
  an illumination system configured to condition a beam of radiation;
  a support structure configured to hold a patterning device, the patterning device configured to impart the beam with a pattern in its cross-section;
  a substrate table configured to hold a substrate; and
  a projection system configured to project the patterned beam as an exposure field onto a substrate,
  wherein the substrate table and the projection system are configured such that, during scanning exposure, the substrate and the radiation beam are scanned relative to one another with the exposure field rotated at an angle relative to the direction of the scanning.

According to an aspect of the invention, there is provided a lithographic apparatus comprising:
  an illumination system configured to condition a beam of radiation;
  a support structure configured to hold a patterning device, the patterning device configured to impart the beam with a pattern in its cross-section;
  a substrate table configured to hold a substrate; and
  a projection system configured to project the patterned beam onto a substrate,
  wherein the illumination system comprises an actuator connected to a component, the actuator arranged to move the component transverse to and in the radiation beam such that a periodic interference pattern is moved over the substrate.

According to an aspect of the invention, there is provided a computer readable medium carrying computer readable program code configured to execute an algorithm that links the number of pulses generated by a lithographic apparatus to an averaging of intensity fluctuations at a substrate being exposed by the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
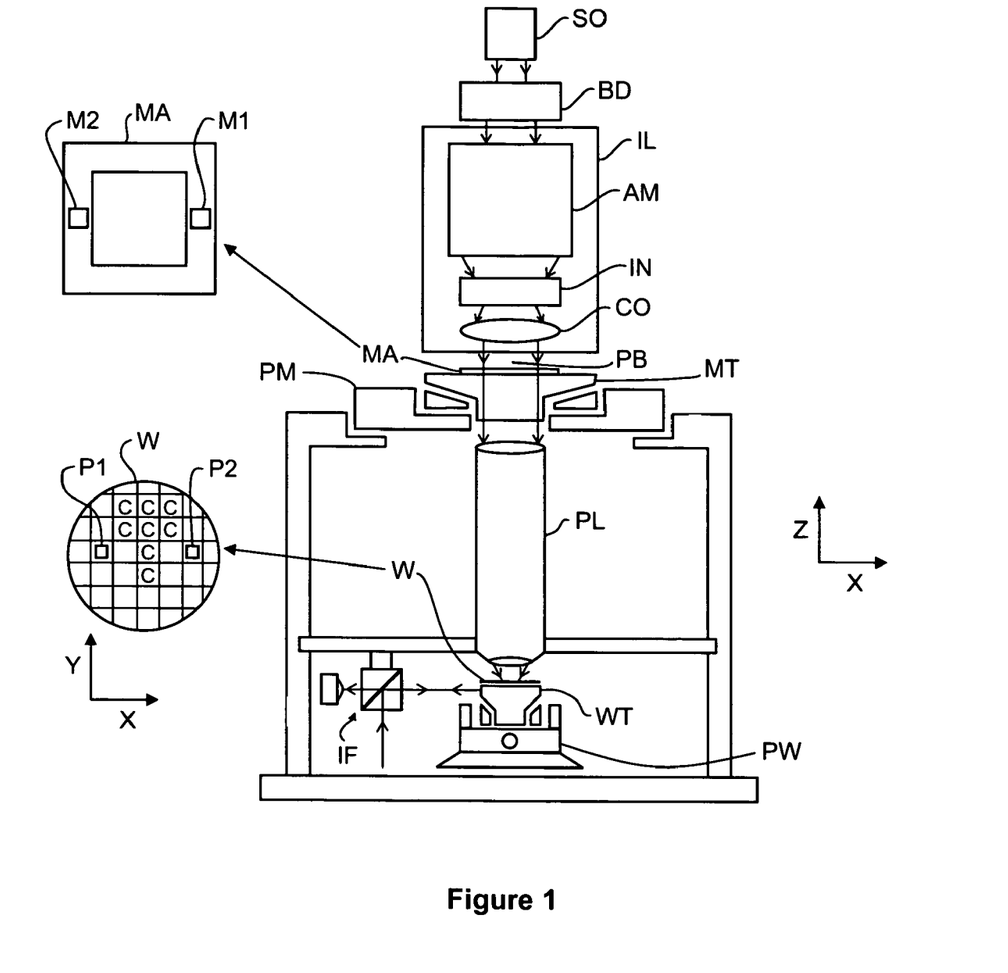
FIG. 1 depicts a lithographic apparatus according to an embodiment of the invention.

FIG. 1 schematically depicts a lithographic apparatus according to a particular embodiment of the invention. The apparatus comprises:
  an illumination system (illuminator) IL configured to provide a beam PB of radiation (e.g. UV radiation or EUV radiation);
  a support structure (e.g. a mask table) MT configured to hold a patterning device (e.g. a mask) MA and connected to a first positioner PM to accurately position the patterning device with respect to item PL;
  a substrate table (e.g. a wafer table) WT configured to hold a substrate (e.g. a resist-coated wafer) W and connected to a second positioner PW to accurately position the substrate with respect to item PL; and a projection system (e.g. a refractive projection lens) PL configured to image a pattern imparted to the beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The support structure holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the beam will correspond to a particular functional layer in a device being created in the target portion, such as an integrated circuit.

Patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjuster AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as a field defining element IN and a condenser (or relay) CO. The illuminator provides a conditioned beam PB of radiation having a desired uniformity and intensity distribution in its cross-section.

The illumination system may also encompass various types of optical components, including refractive, reflective, and catadioptric optical components for directing, shaping, or controlling the beam of radiation, and such components may also be referred to below, collectively or singularly, as a "lens".

The beam PB is incident on the patterning device MA, which is held on the support structure MT. Having traversed the patterning device MA, the beam PB passes through the projection system PL, which focuses the beam onto a target portion C of the substrate W. With the aid of the second positioner PW and position sensor IF (e.g. a microscopic ruler, indexer, or interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

The depicted apparatus can be used in the following modes:

1. In step mode, the support structure MT and the substrate table WT are kept essentially stationary, while an entire pattern imparted to the beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam is projected onto a target portion C (i.e. a single dynamic exposure). The velocity and direction of the substrate table WT relative to the support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the continual drive to improve the performance of lithographic apparatus, various parameters of the lithographic apparatus are monitored. One of these parameters is referred to as the critical dimension. The critical dimension (CD) is commonly defined as the dimension of the smallest geometrical feature (width of an interconnect line, contact, trench, etc.) which can be formed using the lithographic apparatus.

As will be explained below, speckle may affect the critical dimension of a lithographic apparatus. Embodiments of the invention provide a way in which the detrimental effect of speckle on the critical dimension may be reduced.

Referring to FIG. 1, the beam of radiation generated by the radiation source SO may be partially coherent. For example, the radiation source may comprise a laser which generates partially coherent pulses of radiation. In other words, there is a fixed relationship between the electric field values at different locations in the pulse, both in beam cross-section and in time, which does not vary over time. In general the coherence does not extend across the entire pulse. This is why the term 'partially coherent' is used to describe the coherence. Each pulse is fully incoherent with respect to the previously generated pulse.

Figure 2:
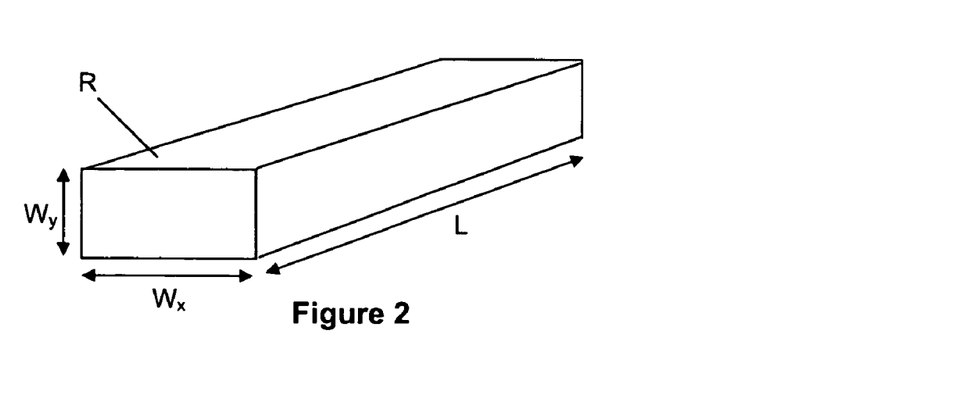
FIG. 2 depicts a rod which comprises a field defining element of the lithographic apparatus.

After passing through the beam delivery system BD, the radiation beam passes through the illuminator IL. The illuminator IL includes field defining element IN which is arranged to define the field of the radiation beam. FIG. 2 shows an example of a field defining element which comprises a rod R. The rod R is rectangular in cross-section and has polished sides. It may, for example, be formed from $CaF_2$ or quartz. The sides of the rod R are not mirrored, although a protective coating may be provided on the sides of the rod.

Figure 3:
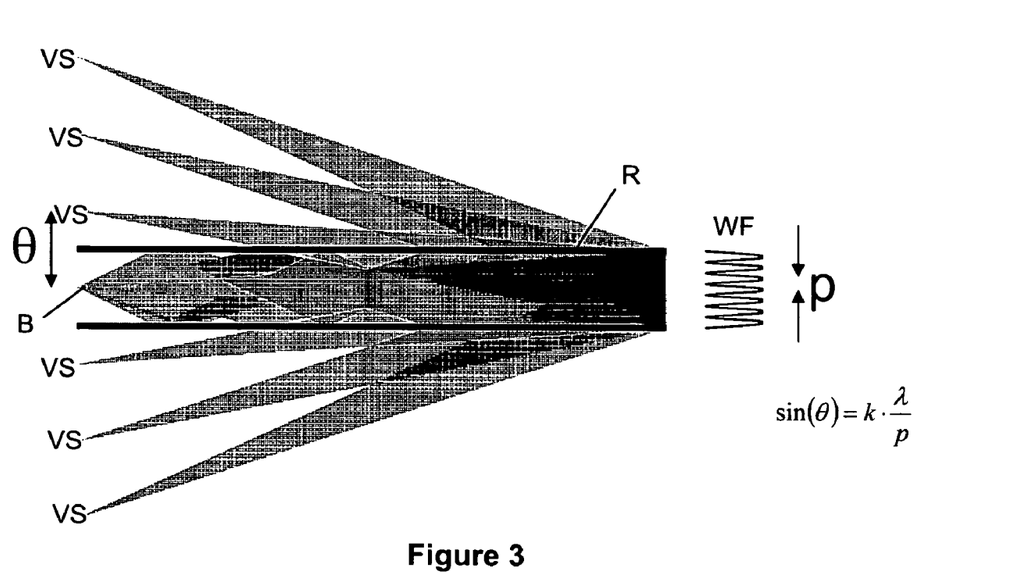
FIG. 3 shows schematically the effect of the rod.

The operation of the rod R is shown schematically in FIG. 3. The radiation beam B enters the rod R, and undergoes total internal reflection at sides of the rod as it propagates along it. This occurs several times before the beam B reaches the opposite end of the rod. The effect of the reflections is that when looking into the exit end of the rod, i.e. looking in the direction A, a plurality of virtual sources VS of radiation are seen. This effective multiplication of the number of sources and their supposition is desired because it integrates the radiation beam, thereby providing a radiation beam which is homogenized.

However, because the radiation beam B is partially coherent, interference of the radiation beam occurs due to the presence of the virtual sources VS. The interference pattern is periodic, and depends upon properties of the rod. The interference is shown schematically in FIG. 3 as a periodic waveform WF. This interference may be considered to be a form of speckle. Speckle is a well known phenomenon, and arises from the mutual interference of partially coherent beams of radiation. In this case, the radiation beams arising from the virtual sources VS may be considered to be the partially coherent beams. Since the radiation beams are made using the rod R, which has a regular structure rather than a random structure, the resulting interference pattern has a periodic structure rather than a random structure.

In conventional operation, a multiplicity of laser pulses are used to deliver sufficient dose to expose a given area of a substrate. In other words, in order to transfer sufficient radiation onto a substrate to induce a required chemical change in resist on the substrate, a certain amount of radiation is required. This radiation may be, for example, delivered by 30 pulses of the source SO, which in this example is a laser. Where the lithographic apparatus operates in scan mode, each pulse of radiation is incident upon a slightly different location on the substrate. This has the beneficial effect that the non-uniformity caused by the interference is averaged out. If the interference pattern were to be different for each radiation pulse, then the interference would be averaged out (the averaging effect being the square root of the number of pulses). However, in the lithographic apparatus the interference pattern does not change from pulse to pulse, and it is periodic. This means that some residual non-uniformity may remain, and this may be sufficient to adversely affect the critical dimension of a pattern imaged onto the substrate. An embodiment of the invention addresses this issue.

The effect of the rod R may be characterized in terms of parcelation angles, where the parcelation angles are the angular separation between adjacent virtual sources VS. The parcelation angle in a given direction is defined by:

$$\sin(\theta_x) = n.\sin\left(\arctan\left(\frac{W_x}{L}\right)\right)$$

where $\theta_x$ is the parcelation angle in the X-direction, n is the index of refraction of the rod, $W_x$ is the width of the rod in the X-direction, and L is the length of the rod (see FIG. 2).

After passing out of the rod, the radiation beam passes through a relay and through the projection system (see FIG. 1), each of which may apply a magnification to the radiation beam. This means that the parcelation of the radiation beam when it is incident upon the substrate is defined by:

$$\sin(\theta_x) = \frac{n.\sin\left(\arctan\left(\frac{W_x}{L}\right)\right)}{\beta_{co} \cdot \beta_{lens}}$$

where $\beta_{co}$ is the condenser (or relay) magnification and $\beta_{lens}$ is the projection system magnification. It will be appreciated that in some instances the magnification may be less than one (i.e. a demagnification). For example, the projection system may have a magnification of ¼.

The coherent addition of radiation coming from discrete angles, i.e. due to the parcelation of the radiation beam, will cause a grating (periodic structure) to appear. The period of the grating on the substrate in the X-direction is:

$$p_x = \frac{\lambda}{\sin(\theta_x)} = \frac{\lambda \cdot \beta_{rema} \cdot \beta_{lens}}{n \cdot \sin(\arctan(W_x/L))}$$

where λ is the wavelength of the radiation beam.

Figure 4:
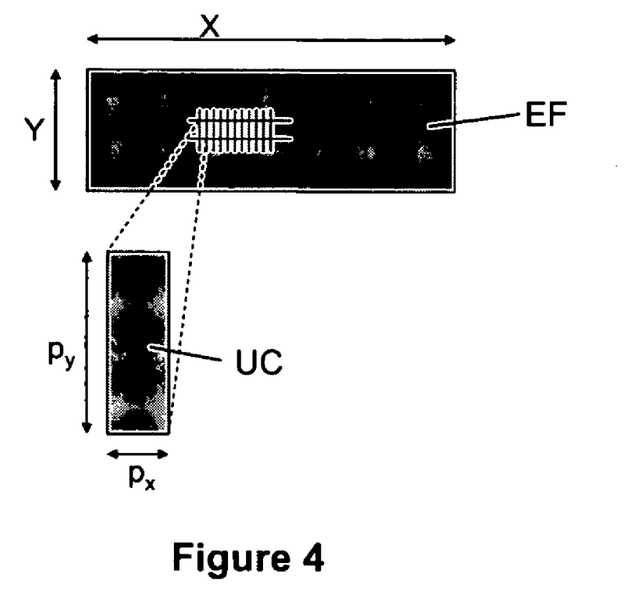
FIG. 4 shows schematically an exposure field of the lithographic apparatus.

FIG. 4 shows schematically an exposure field which is illuminated with radiation during exposure of a substrate using the lithographic apparatus. As can be seen, the exposure field is significantly larger in the X-direction than in the Y-direction. The exposure field is translated over the surface of the substrate in the Y-direction, thereby delivering radiation across the surface of the substrate. This is the scan mode referred to above. Due to the interference effects within the rod R described above, the exposure field will include a periodic structure. Although the above explanation of the interference effects related only to the X-direction, it will be appreciated that due to the rectangular cross-section of the rod, interference effects will also occur in the Y-direction. Thus, the periodic structure in the exposure field EF is periodic in both the X and Y directions.

The period of the periodic structure is $p_x$ in the X-direction and $p_y$ in the Y-direction, are shown schematically in FIG. 4. It can be seen that the dimensions of the periodic structure are different in the X and Y directions. This is because the width $W_x$ of the rod 2 in the X-direction is different from the width $W_y$ of the rod in the Y-direction. The periodic structure may be considered as a set of unit-cells (or unit areas). Within each unit cell UC the same non-uniformities are seen at the same locations. In other words, if a non-uniformity is seen at a particular location in one unit cell UC, the same non-uniformity will be seen at the same location in all of the other unit cells (i.e. non-uniformities are repeated in each unit cell). The non-uniformities which repeat in the unit cells are caused by the partial coherence of the beam (as described further above). There may be other non-uniformities present, which do not repeat in the unit cells, for example low spatial frequency variations. These are not specifically addressed herein.

In order to illustrate the effect of the unit cell UC, possible dimensions and numbers of laser pulses will be used in an example. It will be understood that the example is in no way intended to limit the scope of the invention, but merely to illustrate an issue which may be addressed by an embodiment of the invention. In the example, the unit-cell UC extends for 4 microns in the X-direction and 8 microns in the Y-direction. The exposure field EF extends for 25 millimeters in the X-direction and 7.2 millimeters in the Y-direction. The repetition rate of the laser SO and the scanning speed of the substrate W (and patterning device MA) are selected such that a given point on the substrate will receive 30 laser pulses. In other words, the exposure field EF is covered using 30 pulses. Since the exposure field is 7.2 millimeters in the Y-direction, it follows that there is a separation of 240 microns between pulses. In other words, following a first pulse of radiation, the substrate will move by 240 microns in the Y-direction before the next pulse of radiation occurs.

This example could be considered to be a worst case scenario. The unit-cell UC is 8 microns long in the Y-direction, and the substrate W travels 240 microns between pulses. This means that the distance traveled by the substrate between pulses corresponds exactly to 30 unit-cells. For this reason, the unit-cells of the second pulse will align with the unit-cells of the first pulse. This will also occur for each of the subsequent 28 pulses. The effect of this alignment of the unit cells is that non-uniformities within the unit-cell are added together instead of being averaged out. In other words, if the unit-cell contained, for example, a bright spot at a particular location, this bright spot would be repeatedly imaged at the same location in each unit cell. The result would be a bright spot which is repeated all over the substrate, the bright spot being separated in the Y-direction by a distance of 8 microns. It will be appreciated that this will have an adverse effect on the critical dimension of the pattern imaged by the lithographic apparatus onto the substrate.

While this may be a worst case scenario, the parcelation caused by the rod may still give rise to unwanted intensity variation even if the unit-cells do not happen to align precisely with one another. Since the size of the unit-cell is small, alignment of a newly exposed unit-cell with a previously exposed unit cell may occur periodically. The effect of this is that some of the non-uniformity within the unit-cell is retained and adversely affects the critical dimension of the exposed pattern.

Figure 5:
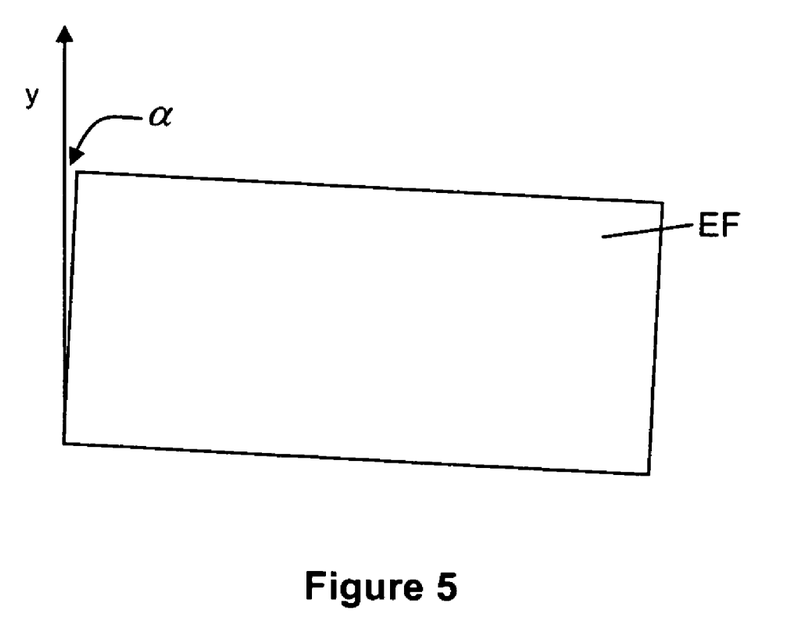
FIG. 5 shows the exposure field rotated relative to a scanning direction of the lithographic apparatus.

An embodiment of the invention addresses this issue by rotating the exposure field with respect to the scanning direction. This rotation may for example be a small rotation. In other words, instead of the exposure field extending precisely in the X and Y directions, there is a small angle between the side of the exposure field and the Y-direction (i.e. the scanning direction). This is shown schematically is FIG. 5. Orienting the exposure field in this way helps ensure that successively exposed unit-cells will not align with one another in the Y-direction. This also reduces the likelihood of non-successive unit cells aligning with one another. This reduces the likelihood that the critical dimension of the exposed pattern is adversely affected by the non-uniformity of the unit cell.

Depending upon the angle of rotation of the exposure field, a unit-cell may for example align with a previously exposed unit-cell, including a displacement in the X-direction. For example, the substrate may travel a distance which corresponds to 30 unit-cells in the Y-direction and 2 unit-cells in the X-direction, so that an exposure aligns unit-cells with previously exposed unit-cells. An embodiment of the invention allows an angle to be determined which will reduce the likelihood that unit cells will align with previously exposed unit cells.

The following relationship may be defined:

$Y = N \cdot Dy$ where Y is the exposure field size in the Y-direction (or effective exposure field size if the field is tapered), N is the number of pulses of radiation which will occur per exposure, and Dy is the distance traveled in the Y-direction between two exposures. It is preferred that N is an integer number, so that dose quantization errors are avoided. Dose quantization errors arise when some points on the substrate receive more pulses of radiation than other points. If N is an integer then each point on the substrate will receive the same number of pulses of radiation. This requirement is relaxed if the exposure field has a tapered intensity profile in the Y-direction (i.e. the intensity of radiation at the front and back of the exposure field reduces gradually to zero). If the exposure field is tapered, then the exposure field has an effective size rather than an actual size, and the requirement that N is an integer is relaxed.

Figure 6:
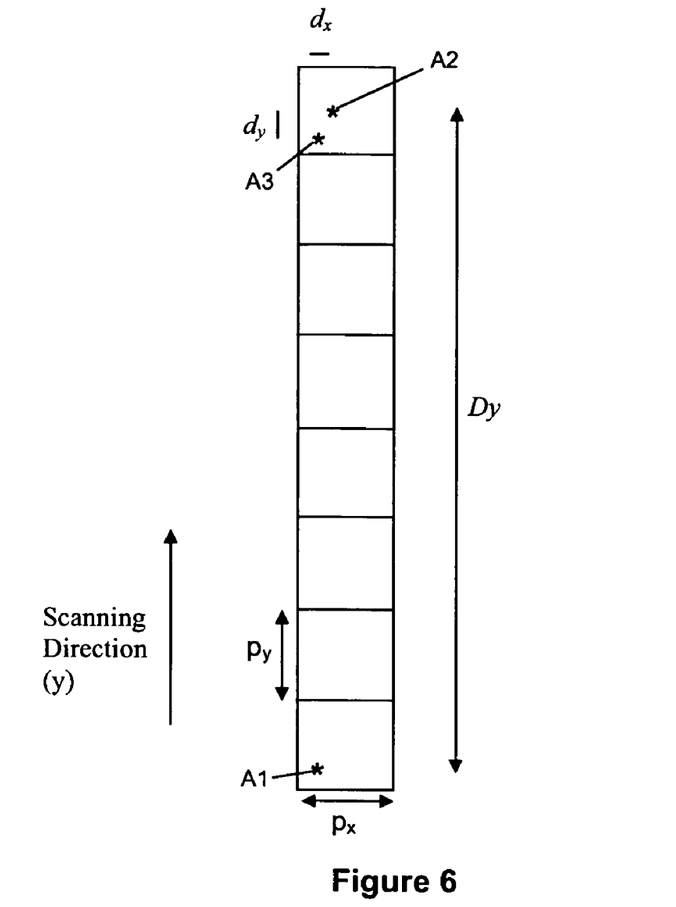
FIGS. 6 and 7 show schematically the effect of the rotation on a scanning exposure.

The distance Dy will usually be larger than the length of the unit-cell in the Y-direction. An example is shown in FIG. 6. In FIG. 6, the distance between successive exposures is Dy, which is seven unit cells plus an additional small distance dy. The size of this additional small distance may be expressed as:

$$dy = \frac{Y}{N} - M \cdot p_y$$

where $p_y$ is the length of the unit-cell in the Y-direction, and M is the number of unit cells between successive pulses. M is determined by rounding $$\left(\frac{Y}{N \cdot p_y}\right)$$

to the nearest whole number.

The distance dx traveled in the X-direction (for this exposure) equals:

$$dx = \frac{p_x}{N}$$

where $p_x$ is the length of the unit-cell in the X-direction. This equation provides a definition of the rotation angle ($\alpha$) of the exposure field with respect to the scan direction:

$$\alpha = inv\,\tan\left(\frac{p_x}{Y}\right).$$

In some instances an integer number k may be used:

$$\alpha = inv\,\tan\left(\frac{k \cdot p_x}{Y}\right)$$

where Y=N·Dy (N being the number of pulses of radiation which will occur per exposure, and Dy being the distance traveled in the Y-direction between two exposures). These equations allow an angle $\alpha$ to be determined which will reduce the likelihood that a unit cell will align with a previously exposed unit cell. Desirably k=1, although other integer values of k may be used.

In order to aid understanding, FIG. 6 includes a bright spot represented schematically by an asterisk. The first exposure will expose the bright spot at a first location A1, and the second exposure will expose the bright spot at a second location A2. The distance between the bright spots in the Y-direction is $D_y$. The position that the first bright spot would have had if it had been exposed in the uppermost unit cell of FIG. 6 is shown as A3. This provides a simple illustration of the distances dy and dx (the distances are represented as lines in FIG. 6).

After a certain number of radiation pulses $$\left(Q = \text{round}\left(\frac{p_y}{dy}\right)\right)$$

a point will be printed next to the original point (the term 'round' indicates rounding of the fraction to the nearest whole number). This point, which for ease of understanding may be thought of as a bright spot, will have a displacement of:

$$\delta y = p_y - Q \cdot dy$$
$$\delta x = Q \cdot \frac{p_x}{N}$$

Based on the above equations, the distance between points above and next to each other can be calculated. In one example, the distance between the points may be selected such that the distance in the X-direction is the same as (or close to) the distance in the Y-direction. The calculation of the difference $\Delta$ between the distances in the X and Y directions is as follows:

$$\Delta = \left|\begin{array}{c} \frac{p_x}{N} \\ \frac{Y}{N} - M \cdot p_y \end{array}\right| - \left|\begin{array}{c} \frac{Q}{N} p_x \\ p_y - Q \cdot d_y \end{array}\right|$$

$$= \sqrt{\left(\frac{p_x}{N}\right)^2 + \left(\frac{Y}{N} - M \cdot p_y\right)^2} - \sqrt{\left(\frac{Q}{N} p_x\right)^2 + (p_y - Q \cdot d_y)^2}$$

Figure 7:
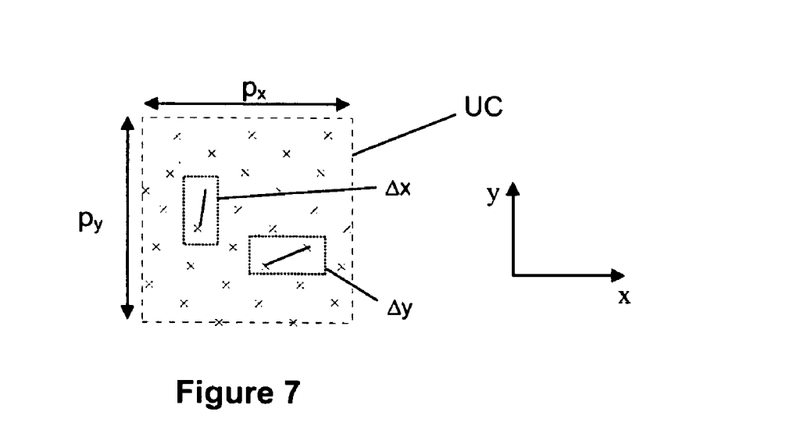

FIG. 7 illustrates schematically a single unit-cell on a substrate, which receives 30.5 pulses of radiation during exposure by a lithographic apparatus. A bright spot is represented by an x. It can be seen that during each exposure the bright spot is located at a different position in the unit cell. These positions are evenly spread out over the unit cell, so that the effect of the bright spot is averaged across the unit cell.

Referring to FIG. 7, $\Delta x$ is the distance to the adjacent bright spot which is nearest in the X-direction and $\Delta y$ is the distance to the adjacent bright spot which is nearest in the Y-direction. The distance $\Delta x$ to the nearest adjacent bright spot in the X-direction is the full distance, and not merely the X-component of the distance. The same applies to the distance to the nearest adjacent bright spot in the Y-direction. The above equation calculates $\Delta$ which is the difference between $\Delta x$ and $\Delta y$. The smaller the difference, the better the averaging out of intensity fluctuations within the unit-cell. Since intensity fluctuations cause the critical dimension to deteriorate, a smaller difference will lead to a better critical dimension.

Figure 8A:
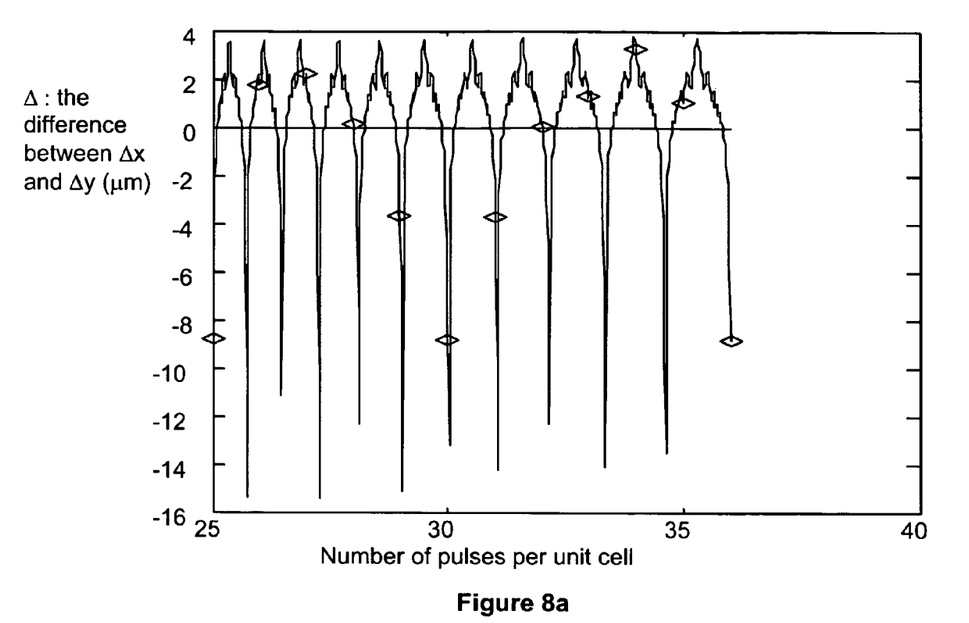
FIG. 8a is a graph which shows the effect of different numbers of pulses of radiation on the distance between successive pulses on the substrate.

FIG. 8a is a graph which shows, for a given unit cell, the effect on the difference $\Delta$ of varying the number of pulses of radiation being provided within that unit cell. Diamonds in FIG. 8a indicate integer numbers of pulses. The data in FIG. 8a were generated based on an effective exposure field size in the Y-direction of 7.2 mm, and a unit cell which is 4 μm in the X-direction and 8 μm in the Y-direction.

Figure 8B:
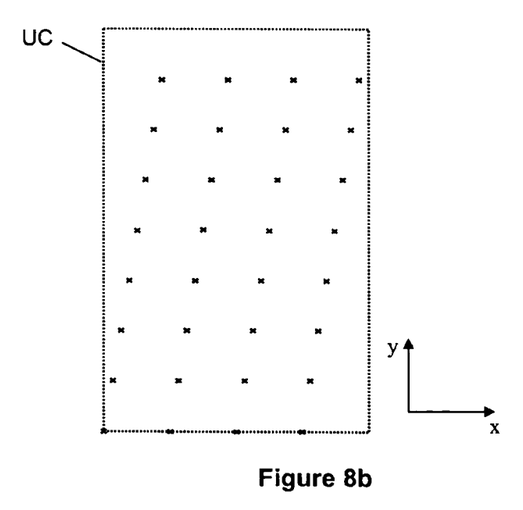
FIG. 8b shows schematically the effect of selecting a particular number of pulses of radiation for an exposure.

It can be seen from FIG. 8a that choosing to have 32 pulses per unit cell will provide a $\Delta$ of close to zero, thereby providing good averaging of intensity fluctuations across the unit cell. On the other hand, having 34 pulses per unit cell will cause a substantial difference $\Delta$ to arise, thereby providing poor averaging of intensity fluctuations across the unit cell. FIG. 8b shows the effect of choosing 32 pulses per unit cell—a bright spot (represented by an x) will be spread evenly across the unit cell. There are 28 unit cells between exposures. This is determined by rounding $$\left(\frac{Y}{N \cdot p_y}\right)$$

to the nearest whole number.

Thus, the equation above, as represented in FIG. 8a, allows the selection of a number of pulses per unit cell which will provide improved averaging of intensity fluctuations across a unit cell. This selection may be performed automatically by a processor, which may, for example, be provided as part of the lithographic apparatus. The processor may be a computer. The processor may include executable software code and/or hardware to perform the above algorithm, and may be arranged to generate data using the algorithm. A user may select the number of pulses per unit cell, instead of using the processor.

Typically, the selection may begin by starting with a target number, for example based on the known transmission of the optics of the lithographic apparatus, and the radiation dose needed to expose the resist provided on the substrate. Data of the type shown in FIG. 8a may then be used to find the number of pulses closest to the target number which provides a zero difference $\Delta$, or a value of $\Delta$ which is close to zero. If the exposure field has a tapered intensity profile in the Y-direction (i.e. the intensity of radiation at the front and back of the exposure field reduces gradually to zero), then the number of pulses is not required to be an integer. Therefore, the selection process may comprise starting from the target number, and then finding the nearest number of pulses (probably a non-integer number) at which the value of $\Delta$ is zero, or a value of $\Delta$ which is close to zero.

Figure 9:
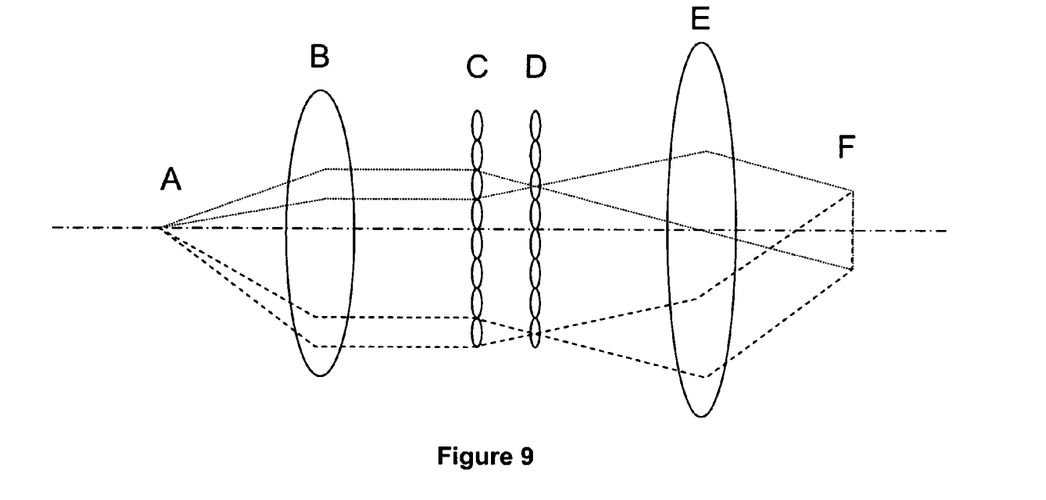
FIG. 9 shows schematically a further field defining element of the lithographic apparatus.

Although an embodiment of the invention has been described in relation to a field defining element IN which is in the form of a rod R, other forms of field defining element may be used and an embodiment of the invention may be applied in the same manner. For example, an embodiment of the invention may be applied to an illumination system which includes a fly-eye lens, an example of which is shown in FIG. 9. Referring to FIG. 9, a radiation source A generates radiation which passes through a first convex lens B. A lens group may be used here; the convex lens B is merely given as an example. The convex lens B collimates the radiation into a beam, which passes through a first fly-eye lens C. The fly-eye lens comprises a two-dimensional array of convex lenses (referred to as lenslets). The fly-eye lens C separates the radiation beam into a plurality of individual radiation beams, which are focused onto a focal plane. A second fly-eye lens D is located in that focal plane, each lenslet receiving a different radiation beam. Multiple coherent copies of the original radiation beam are present at the second fly-eye lens D. These are focused by a second convex lens E onto a patterning device F. The presence of multiple coherent copies of the radiation beam will give rise to interference patterns, which in turn will be projected by a projection system (not shown) onto a substrate (not shown). The interference pattern projected on the substrate will have a periodic structure which is dependent upon the fly-eye lenses C, D. An embodiment of the invention may be used to determine an angle at which the substrate should be oriented (relative to the scanning direction) in order to reduce the impact of the interference on the projected pattern, and may be used to determine a number of radiation pulses which will assist in reducing the impact of the interference.

It is possible to use an alternative configuration in which the second fly-eye lens D is not present. For example, this may be done if the radiation source A is small, or provides illumination which is only on-axis.

In a further arrangement, one or more diffractive elements (not shown) may be used in place of either or both of the fly-eye lenses.

The rod and the fly-eye lens described above are examples of a field defining element. When a field defining element is used in an illumination system, parcelation angles (at substrate level) can be defined based upon field defining element size, field lens F-number, the magnification of a patterning device masking lens, and the magnification of a projection system. An embodiment of the invention allows the parcelation angles to be used to determine an angle at which the substrate should be oriented (relative to the scanning direction) in order to reduce the impact of the interference on the projected pattern, and may be used to determine a number of radiation pulses which will assist in reducing the impact of the interference.

Those skilled in the art may believe that the above described embodiment of the invention violates scan-synchronization. However, this is not the case. Scan-synchronization has the image of the patterning device MA at substrate W level moving in the same direction, and with the same speed, as the substrate table. In other words it relates the substrate table movement to the patterning device support structure movement. The absolute direction of movement of the image of the patterning device MA and the speed of movement are free parameters, i.e. they may be modified without violating scan-synchronization.

Figure 10:
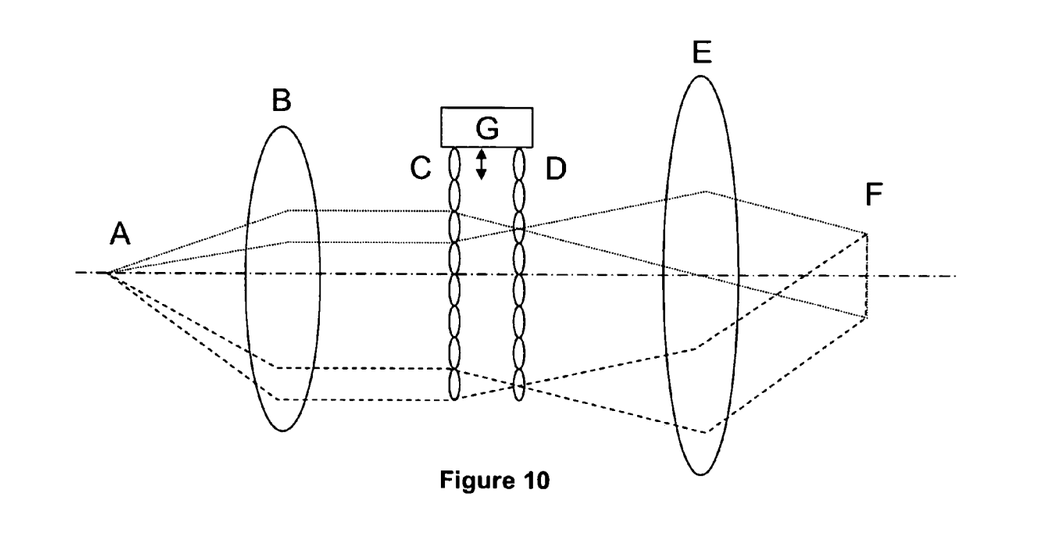
FIG. 10 shows schematically a further embodiment of the invention.

An embodiment of the invention has been described in a lithographic apparatus operating in scan mode. However, an embodiment of the invention may be used in a lithographic apparatus which operates in step mode (step mode is described further above). FIG. 10 shows schematically an embodiment of the invention, which is suitable for a lithographic apparatus operating in step mode. The lithographic apparatus may include the components shown in FIG. 1 (described further above). Where a pulsed radiation source is used by the apparatus, a plurality of pulses are used to expose each exposure field on a substrate.

FIG. 10 shows components of an illuminator. The components correspond to those shown in FIG. 9, and the same reference letters are used in the figure. A radiation source A generates radiation which passes through lens B (or lens group). The lens B collimates the radiation into a beam, which passes through a first fly-eye lens C which comprises a two-dimensional array of convex lenses (referred to as lenslets). The fly-eye lens C separates the radiation beam into a plurality of individual radiation beams, which are focused onto a focal plane. A second fly-eye lens D is located in that focal plane, each lenslet receiving a different radiation beam. Multiple coherent copies of the original radiation beam are present at the second fly-eye lens D. These are focused by a second convex lens E onto a patterning device F. The presence of multiple coherent copies of the radiation beam gives rise to an interference pattern, which is projected by a projection system (not shown) onto a substrate (not shown).

An actuator G is connected to the fly-eye lenses C, D and moves them back and forth in a direction which is transverse to the optical axis of the lenses B, E. The actuator may, for example, be a piezo-electric actuator, or an electric motor (the motor should provide a substantially linear movement). The movement of the fly-eye lenses C, D is arranged such that the interference pattern caused by the fly-eye lenses C, D is located at a different position on the substrate for each pulse during exposure of a target area, while the envelope of the field itself is stationary. In this way, the net effect of the interference pattern is significantly reduced.

Figure 11:
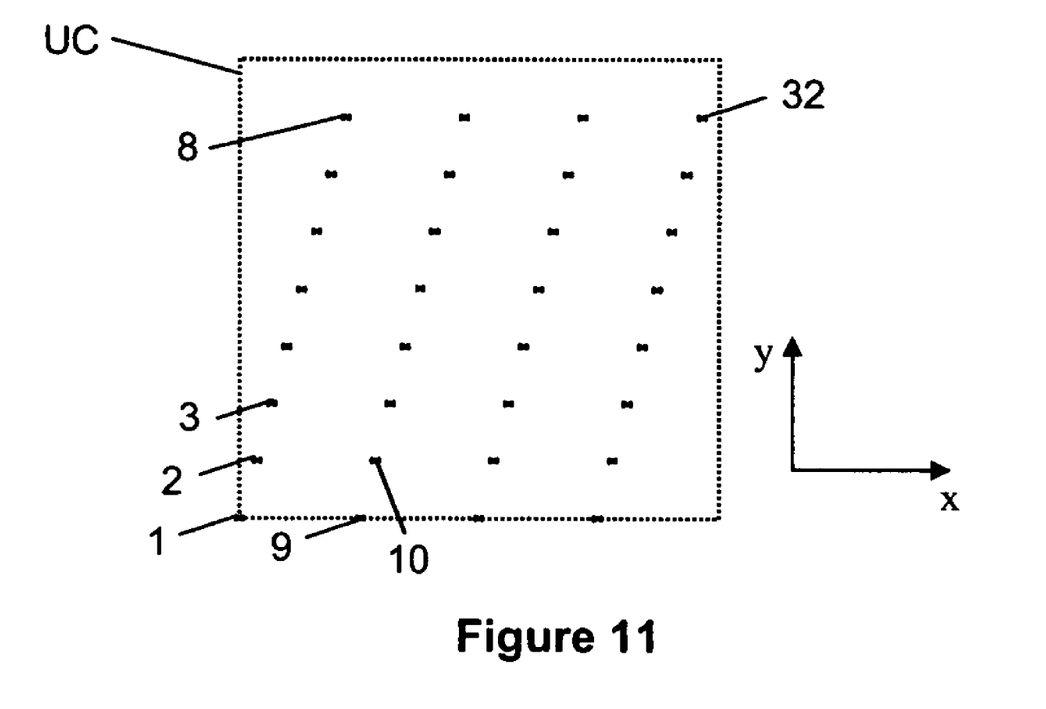
FIG. 11 shows schematically the effect of an embodiment of the invention.

The movement which is required may be determined in a manner which is similar, but more straightforward, than that described in relation to the embodiment described above. Referring to FIG. 11, a bright spot indicated by an 'x' is present in a unit cell UC. The number of pulses which will be used to expose an exposure field is known, for example in this case it is 32.

During a first pulse, the bright spot 1 is in the bottom left hand corner of the unit cell. The actuator G moves the fly-eye lenses C, D before the second pulse, such that when the second pulse takes place the bright spot 2 has moved upwards and to the right. The actuator G again moves the fly-eye lenses C, D before the third pulse, such that when the third pulse takes place the bright spot 3 has moved further upwards and further to the right. This continues until the eighth pulse, as shown by the bright spot 8. After this the bright spot moves into an adjacent unit cell (not shown). At the same time, the equivalent bright spot from a different adjacent unit cell (not shown) enters the unit cell UC. This is shown as bright spot 9. By the time of the tenth pulse, the bright spot has moved upwards and to the right, as shown by bright spot 10, etc. This process continues until the thirty second pulse, which is the final pulse of the exposure. The bright spot of the $32^{nd}$ pulse is indicated in FIG. 11 as bright spot 32. For ease of understanding, in this paragraph the terms left, right, up and down have been used in place of positive X, negative X, positive Y and negative Y directions respectively.

It can be seen from FIG. 11, that movement of the fly-eye lenses C, D is arranged such that the interference pattern is distributed evenly across a unit cell UC. In order to determine the amount of movement required, one should first determine the number of pulses that are required per exposure (this will depend upon the energy per pulse, and the energy required to expose the resist). Equations which correspond with the equations above may be used to represent the relative displacement of the interference pattern of two successive pulses in the X and Y directions:

$$dy = \frac{Y}{N}$$
$$dx = \frac{p_x}{N}$$

where Y is the total movement of the interference pattern in the Y-direction over all of the pulses of the exposure, N is the number of pulses which are used for the exposure, and $p_x$ is the length of the unit cell in the X-direction. The conversion of the movement of the interference pattern into movement of the field defining element depends upon the lens E between the field defining element and the field F, and on the projection system PL (see FIG. 1). The equations are identical to the equations further above, with M=0 and k=0. Other values of M and k are possible, but these require larger movements of the field defining element.

Two pulses adjacent to each other may be expressed as:

$$\delta y = p_y - Q \cdot dy$$
$$\delta x = Q \cdot \frac{p_x}{N}$$

an expression which corresponds exactly with that used further above. By minimizing the difference between δx and δy one may determine an advantageous spacing of the interference pattern.

Once it has been determined over how many unit cells the movement will be, and the number of pulses per exposure has been determined, the size and the angle of the movement may be calculated using trigonometry. The lenslet dimensions in the fly-eye lenses C, D is the relevant dimension when determining the required movement. Since it is the lenslets which give rise to the periodic interference pattern, the dimensions of the lenslets give rise to the dimensions of the unit cell. In other words, a movement of the fly-eye lenses C, D by a distance equal to the separation between the centers of adjacent lenslets, will give rise to a movement of the interference pattern at the substrate of one unit cell.

In general, the movement over an exposure may be one unit cell in a first direction and a multiple number of unit cells in the other direction. For example, in FIG. 11 the movement is one unit cell in the X-direction and 4 unit cells in the Y-direction. Where the movement is four unit cells for a given exposure, then the movement of the fly-eye lenses C, D during that exposure will be four times the distance between the centers of adjacent lenslets. The angle α of the movement is then:

$$\alpha = \arctan\left(\frac{4 \cdot ls}{lt}\right)$$

where ls is the distance between the centers of adjacent lenslets in the scanning direction, and lt is the distance between the centers of adjacent lenslets in the transverse direction. The total number of pulses used for the exposure is an integer. Note however, that the resulting number of pulses has to be an integer. The distance Y is not constrained, for example by the size of the exposure field, and may be any suitable distance.

Determination of the angle and distance of the movement may be done by an operator of the lithographic apparatus, or alternatively may be done by a processor or other suitable computational apparatus.

The actuator G may be configured such that the movement of the fly-eye lenses C, D is continuous in a certain direction during all of the pulses of an exposure, and is then continuous in the opposite direction during all of the pulses in the next exposure. The direction may then reverse again for the next exposure, etc. Alternatively, the fly-eye lenses C, D may continue in the same direction for a plurality of exposures before the direction is reversed. Since the direction of movement is reversed between exposures, the time available for the actuator G to reverse the direction is considerable (for example compared to a continuously modulated movement). This is because reversing can be performed in between exposures, when the substrate table is moved to another exposure location.

Although an embodiment of the invention has been described in relation to a pair of fly-eye lenses, an embodiment of the invention may be used in combination with other field defining elements. For example, an embodiment of the invention may be used in combination with a rod or in combination with diffractive elements. The distance and angle of movement of the field defining element is determined in an equivalent manner, i.e. based upon the dimensions of the field defining element.

It should be noted that movement of the field defining element does not cause movement of the illuminated field on the patterning device MA (see FIG. 1), and does not cause movement of the patterning device pattern projected onto the substrate W. It is only the interference pattern, caused by the field defining element, which moves. This is a common feature between the first and second embodiments of the invention, i.e. that the interference pattern is moved with respect to the substrate between pulses. The movement may be arranged such that the interference pattern is averaged out by the effect of multiple pulses.

Although embodiments of the invention have been described in relation to lithographic apparatus which use a pulsed source of radiation, an embodiment of the invention may also be used in lithographic apparatus which uses a continuous source of radiation. Where this is the case, although the exposure is not formed from a series of pulses, movement between the periodic interference pattern and the substrate, in a direction which is not parallel to a direction of repetition of the periodic interference pattern, is still beneficial.

Although specific reference may be made in this text to the use of lithographic apparatus in the manufacture of ICs, it should be understood that the lithographic apparatus (and method) described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. The description is not intended to limit the invention.

The invention claimed is:

1. A method of lithography, comprising:
    conditioning a radiation beam using an illumination system of a lithographic apparatus;
    imparting the radiation beam with a pattern in its cross-section; and
    projecting the patterned beam of radiation as an exposure field onto a substrate,
    wherein a periodic interference pattern is present in the exposure field, and relative motion is established between the substrate and a component in the illumination system, such that the periodic interference pattern is displaced in a direction which is not parallel to a direction of repetition of the periodic interference pattern, and
    wherein the number of radiation pulses received at a given location is selected using an algorithm which links the number of pulses to the effect of the periodic interference pattern for a particular angle of the direction.

2. The method of claim 1, wherein radiation beam comprises radiation pulses and the interference pattern defines a repeating unit cell, wherein the motion is such that between successive radiation pulses the periodic interference pattern is displaced in a direction which is not parallel to a direction of repetition of unit cells.

3. The method of claim 2, wherein a plurality of radiation pulses are used to complete exposure at a given location on the substrate, and the motion is such that for each radiation pulse a different part of the periodic interference pattern is projected at that location.

4. The method of claim 1, wherein the substrate is scanned relative to the radiation beam such that the exposure field is scanned over the substrate, the exposure field being rotated at an angle relative to the direction of the scanning.

5. The method of claim 4, wherein the angle is determined using $$\alpha = inv\, \tan\left(\frac{k \cdot p_x}{Y}\right),$$

where k is an integer, $p_x$ is the length of the unit cell transverse to the scanning direction, and Y is the exposure field size in the Y-direction.

6. A method of lithography, comprising:
    conditioning a radiation beam using an illumination system of a lithographic apparatus;
    imparting the radiation beam with a pattern in its cross-section; and
    projecting the patterned beam of radiation as an exposure field onto a substrate,
    wherein a periodic interference pattern is present in the exposure field, and relative motion is established between the substrate and a component in the illumination system, such that the periodic interference pattern is displaced in a direction which is not parallel to a direction of repetition of the periodic interference pattern, and
    wherein the number of radiation pulses received at a given location is selected using an algorithm which links the number of pulses to the effect of the periodic interference pattern, wherein the algorithm defines a relationship between the number of pulses and the difference, of the position of the periodic interference pattern, between pulses adjacent in the X-direction and pulses adjacent in the Y-direction, taking into account movement due to scanning.

7. The method of claim 6, wherein the algorithm defines a unit area over which interference effects are seen, and the relationship between the number of pulses and the difference, of the position of the periodic interference pattern, between separation of pulses adjacent in the X-direction and pulses adjacent in the Y-direction, is defined within the unit area.

8. The method of claim 1, wherein the algorithm defines a unit area over which interference effects are seen, and the algorithm links the number of pulses received and the extent to which a given intensity fluctuation may be averaged out across the unit area.

9. The method of claim 1, wherein the component in the illumination system is scanned transverse to the radiation beam such that the periodic interference pattern is moved over the substrate.

10. The method of claim 9, wherein the component comprises a field defining element.

11. The method of claim 10, wherein the movement of the field defining element is a linear movement, and is in a direction which is not parallel to a line which passes through the center of adjacent repeating structures of the field defining element, or in a direction which is not parallel to an edge of the field defining element.

12. The method of claim 11, wherein the movement continues in the same direction during a given exposure.

13. The method of claim 12, wherein after the exposure the direction of the movement reverses.

14. A lithographic apparatus comprising:
a support structure configured to hold a patterning device, the patterning device configured to provide a beam with a pattern in its cross-section;
a substrate table configured to hold a substrate;
a projection system configured to project the patterned beam as an exposure field onto a substrate, wherein the substrate table and the projection system are configured such that, during scanning exposure, the substrate and the radiation beam are scanned relative to one another with the exposure field rotated at an angle relative to the direction of the scanning; and
a processor configured to select the number of radiation pulses received at a given location by executing an algorithm that links various values of the number of pulses capable of being provided by the radiation beam with the averaging of intensity fluctuations at the substrate for the angle.

15. A lithographic apparatus comprising:
a support structure configured to hold a patterning device, the patterning device configured to provide a beam with a pattern in its cross-section;
a substrate table configured to hold a substrate;
a projection system configured to project the patterned beam as an exposure field onto a substrate, wherein the substrate table and the projection system are configured such that, during scanning exposure, the substrate and the radiation beam are scanned relative to one another with the exposure field rotated at an angle relative to the direction of the scanning; and
a processor configured to execute an algorithm that links the number of pulses capable of being provided by the radiation beam with the averaging of intensity fluctuations at the substrate, wherein the algorithm defines a relationship between the number of pulses and the difference between separation of pulses adjacent in the X-direction and pulses adjacent in the Y-direction, taking into account movement due to scanning.

16. The apparatus of claim 15, wherein the algorithm defines a unit area over which interference effects are seen, and the relationship between the number of pulses and the difference between separation of adjacent pulses in the X-direction and adjacent pulses in the Y-direction, is defined within the unit area.

17. The apparatus of claim 14, wherein the algorithm defines a unit area over which interference effects are seen, and the algorithm links the number of pulses received and the extent to which a given intensity fluctuation may be averaged out across the unit area.

18. A non-transitory computer readable storage medium carrying computer readable program code configured to execute an algorithm that links the number of pulses capable of being generated by a lithographic apparatus to an averaging of intensity fluctuations at a substrate being exposed by the lithographic apparatus, for a particular relative motion between the substrate and a component in an illumination system of the lithographic apparatus, such that a periodic interference pattern present in an exposure field of the lithographic apparatus is displaced in a direction which is not parallel to a direction of repetition of the periodic interference pattern, wherein the algorithm defines a relationship between the number of pulses and the difference between separation of pulses adjacent in the X-direction and pulses adjacent in the Y-direction, taking into account movement due to scanning.

19. The non-transitory computer readable storage medium of claim 18, wherein a plurality of radiation pulses are used to complete exposure at a given location on the substrate, and the motion is such that for each radiation pulse a different part of the periodic interference pattern is projected at that location.

20. The non-transitory computer readable storage medium of claim 18, wherein the substrate is scanned relative to the radiation beam such that the exposure field is scanned over the substrate, the exposure field being rotated at an angle relative to the direction of the scanning.

21. The non-transitory computer readable storage medium of claim 20, wherein the angle is determined using $$\alpha = inv\,\tan\left(\frac{k \cdot p_x}{Y}\right),$$

where k is an integer, $p_x$ is the length of the unit cell transverse to the scanning direction, and Y is the exposure field size in the Y-direction.

22. The non-transitory computer readable storage medium of claim 18, wherein the algorithm defines a unit area over which interference effects are seen, and the relationship between the number of pulses and the difference, of the position of the periodic interference pattern, between separation of pulses adjacent in the X-direction and pulses adjacent in the Y-direction, is defined within the unit area.

* * * * *